(12) United States Patent
Hsu et al.

(10) Patent No.: US 10,760,896 B2
(45) Date of Patent: Sep. 1, 2020

(54) ELLIPSOMETER AND METHOD FOR ESTIMATING THICKNESS OF FILM

(71) Applicant: TAIWAN SEMICONDUCTOR MANUFACTURING COMPANY LTD., Hsinchu (TW)

(72) Inventors: Feng Yuan Hsu, Yilan County (TW); Chi-Ming Yang, Hsinchu (TW); Ching-Hsiang Hsu, Hsinchu (TW); Chyi Shyuan Chern, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 79 days.

(21) Appl. No.: 16/116,135

(22) Filed: Aug. 29, 2018

(65) Prior Publication Data
US 2020/0072598 A1     Mar. 5, 2020

(51) Int. Cl.
*G01B 11/06*     (2006.01)
*H01L 21/66*     (2006.01)
*G01N 21/21*     (2006.01)

(52) U.S. Cl.
CPC ........ *G01B 11/0641* (2013.01); *G01N 21/211* (2013.01); *H01L 22/12* (2013.01)

(58) Field of Classification Search
CPC ... G01B 11/0616; G01B 11/065; G01B 11/06; G01N 21/211
See application file for complete search history.

(56) References Cited

U.S. PATENT DOCUMENTS

| | | | | |
|---|---|---|---|---|
| 4,718,766 A | * | 1/1988 | Greenstein | G01C 19/66 356/472 |
| 5,872,630 A | * | 2/1999 | Johs | G01J 3/447 250/225 |
| 6,628,397 B1 | * | 9/2003 | Nikoonahad | B24B 37/005 356/445 |
| 7,468,794 B1 | * | 12/2008 | Liphardt | G01N 21/211 356/369 |
| 7,633,625 B1 | * | 12/2009 | Woollam | G01J 3/02 356/369 |
| 10,393,514 B2 | * | 8/2019 | Pandey | G01B 11/2513 |
| 2006/0268272 A1 | * | 11/2006 | Liphardt | G01J 3/02 356/369 |
| 2011/0071784 A1 | * | 3/2011 | Smith | G01B 11/0608 702/94 |
| 2011/0188040 A1 | * | 8/2011 | He | G01J 4/00 356/365 |
| 2015/0055123 A1 | * | 2/2015 | Rotter | G02B 5/3091 356/51 |
| 2015/0219497 A1 | * | 8/2015 | Johs | G01J 4/02 356/367 |

* cited by examiner

*Primary Examiner* — Shawn Decenzo
(74) *Attorney, Agent, or Firm* — WPAT, P.C., Intellectual Property Attorneys; Anthony King (57) ABSTRACT

An ellipsometer includes a light source, a polarizer, an asymmetric wavelength retarder, an analyzer and an optical detection component. The light source is configured to provide a light beam having multiple wavelengths incident to a sample. The polarizer is disposed between the light source and the sample, and configured to polarize the light beam. The asymmetric wavelength retarder is configured to provide a varied retardation effect on the light beam varied by wavelength. The analyzer is configured to analyze a polarization state of the light beam reflected by the sample. The optical detection component is configured to detect the light beam from the analyzer.

20 Claims, 10 Drawing Sheets

ELLIPSOMETER AND METHOD FOR ESTIMATING THICKNESS OF FILM

BACKGROUND

Ellipsometer is an optical instrument using a monochromic polarized light to estimate characteristics of a sample. One common application of ellipsometer is to estimate the thickness of a thin film. The conventional ellipsometer, however, include a rotation mechanism for mechanically rotating a polarizer or a wavelength retarder to change the polarization direction of the incident light during estimation, such that a plurality sets of ellipsometric parameters corresponding to different polarization states can be sequentially obtained. Accordingly, the thickness of the thin film can be estimated based on the plurality sets of ellipsometric parameters. The conventional approach, however, takes a long time to obtain the required ellipsometric parameters, and thus is difficult to in-situ measure the thickness of the thin film during a manufacturing operation.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

An ellipsometer is an optical instrument used to measure the ellipticity of a polarized light beam by use of ellipsometry, and the ellipsometer has been commonly used to estimate characteristics of a sample such as the film thickness of the sample. The ellipsometry is a non-destructive optical measurement approach, which does not destroy the sample during measurement. The ellipsometry is also advantageous for its high accuracy, particularly in measuring a thin film having a thickness less than 100 micrometers.

Figure 1:
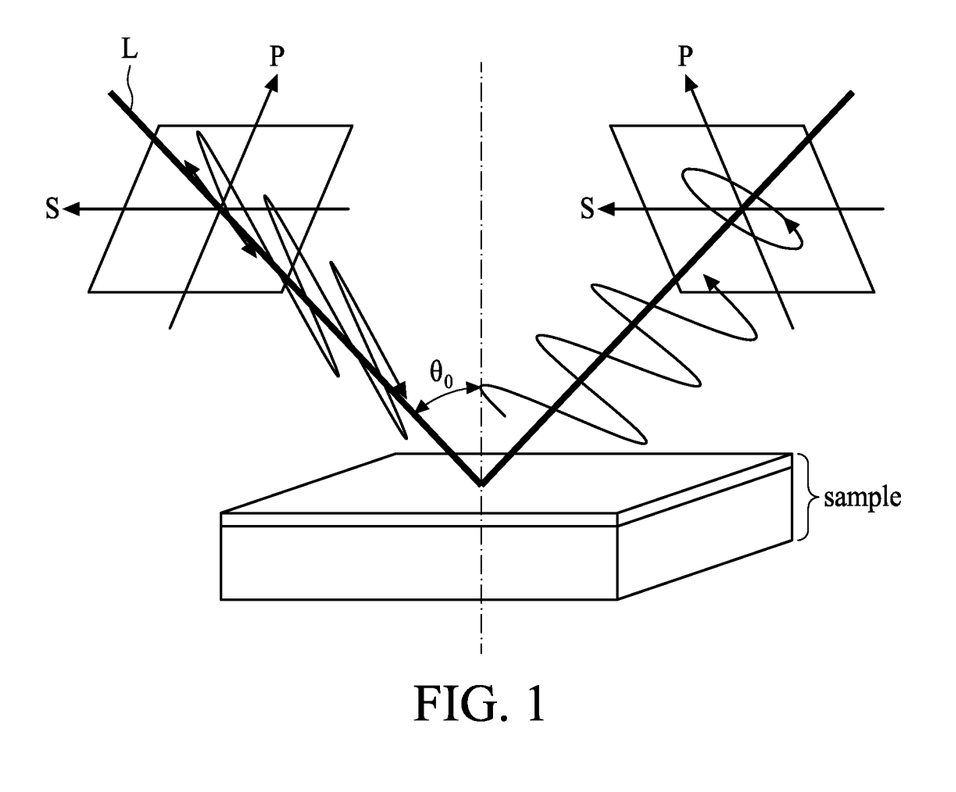
FIG. 1 is a schematic diagram illustrating ellipsometry in accordance with some embodiments of the present disclosure.

FIG. 1 is a schematic diagram illustrating ellipsometry in accordance with some embodiments of the present disclosure. As shown in FIG. 1, when measuring the thickness, a polarized light beam L is impinged on a sample with an incident angle. The sample may include a transparent film 102 formed on top of a substrate 101. The polarization state of the light beam reflected by the sample is detected, and calculated so as to estimate the film thickness of the transparent film. In the ellipsometry, the film thickness is not measured immediately. Instead, the change in the polarization state expressed as ψ and Δ are measured, where ψ and Δ determine the differential changes in amplitude and phase, respectively, after reflection by the components of the electric vector parallel and perpendicular to the incidence plane.

In the ellipsometry, it is normally to describe the polarization states in a system of two orthogonal basis vector (p, s). The s-direction is perpendicular to the incidence plane, while the p-direction is parallel to the incidence plane. The polarization state in the ellipsometry can be described by two ellipsometric parameters tanψ and Δ. The first ellipsometric parameter tanψ represents the change of the absolute value of the complex Fresnel reflection coefficient (Rs, Rp) with given wavelength and incident angle, while the second ellipsometric parameter Δ represents the phase difference between the complex Fresnel reflection coefficient (Rs, Rp), i.e., Δp-Δs. The relation between polarization state change and the ellipsometric parameters tanψ and Δ can be expressed as equation (1).

$$\rho = Rp/Rs = \tan\psi \exp[j\Delta] \quad (1)$$

where ρ represents polarization reflectivity ratio.

The amplitude ratio ψ and phase difference Δ are physical quantities obtained by measurement during ellipsometry. For example, the amplitude ratio ψ can be obtained by an optical detection component, and the phase difference Δ can be obtained by measuring the retardation effect of the incident light. Once the ellipsometric parameters corresponding to the reflected light beam is obtained, the film thickness can be calculated based on the ellipsometric parameters.

In some embodiments of the present disclosure, an ellipsometer using a multiple wavelength light source and an asymmetric wavelength retarder is provided. The asymmetric wavelength retarder is able to provide a varied retardation effect on the multiple wavelength light beam by wavelength, such that a plurality of sub-beams of different retardation effects can be generated simultaneously. The sub-beams of different retardation effects reflected by the sample therefore have different polarization states. The polarization states of the plurality of sub-beams can be analyzed by an analyzer, and detected by an optical detection component. Accordingly, a plurality sets of ellipsometric parameters can be measured at the same time, and the film thickness can be rapidly estimated.

Figure 2:
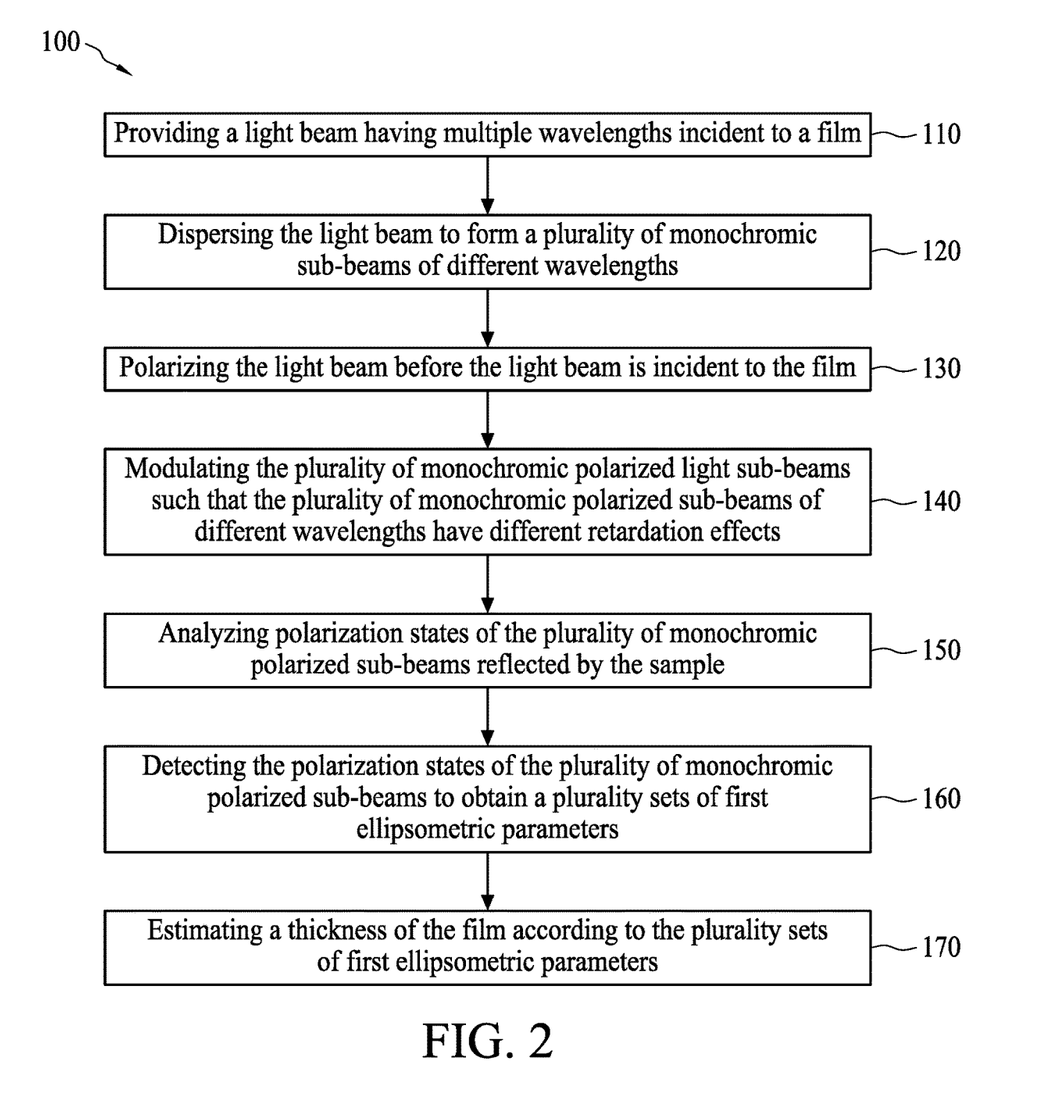
FIG. 2 is a flow chart illustrating a method for estimating characteristic of a film according to various aspects of one or more embodiments of the present disclosure.

FIG. 2 is a flow chart illustrating a method for estimating characteristic of a film according to various aspects of one or more embodiments of the present disclosure. The method 100 begins with operation 110 in which a light beam having multiple wavelengths incident to a film is provided. The method 100 proceeds with operation 120 in which the light beam is dispersed to form a plurality of monochromic sub-beams of different wavelengths. The method 100 proceeds with operation 130 in which the light beam is polarized before the light beam is incident to the film. The method 100 proceeds with operation 140 in which the plurality of monochromic polarized light sub-beams are modulated such that the plurality of monochromic polarized sub-beams of different wavelengths have different retardation effects. The method 100 proceeds with operation 150 in which the polarization states of the plurality of monochromic polarized sub-beams reflected by the sample are analyzed. The method 100 proceeds with operation 160 in which the polarization states of the plurality of monochromic polarized sub-beams are detected to obtain a plurality sets of first ellipsometric parameters. The method 100 proceeds with operation 170 in which a thickness of the film is estimated according to the plurality sets of first ellipsometric parameters.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 3:
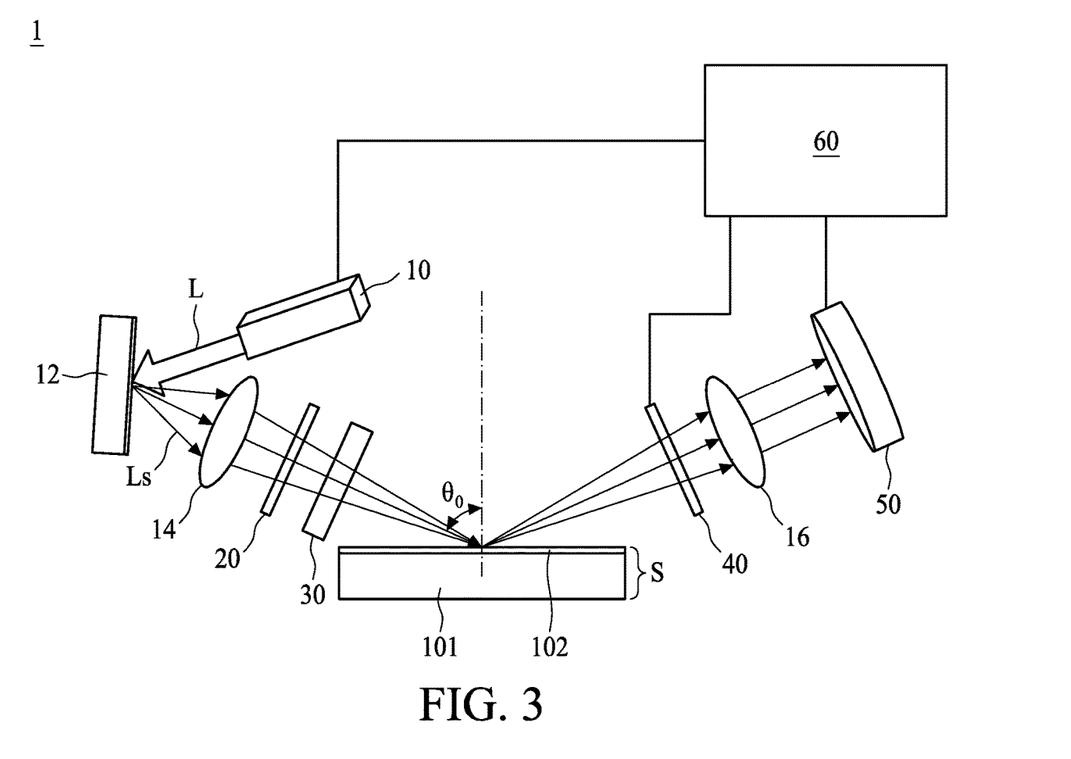
FIG. 3 is a schematic diagram illustrating an ellipsometer in accordance with some embodiments of the present disclosure.
Figure 3A:
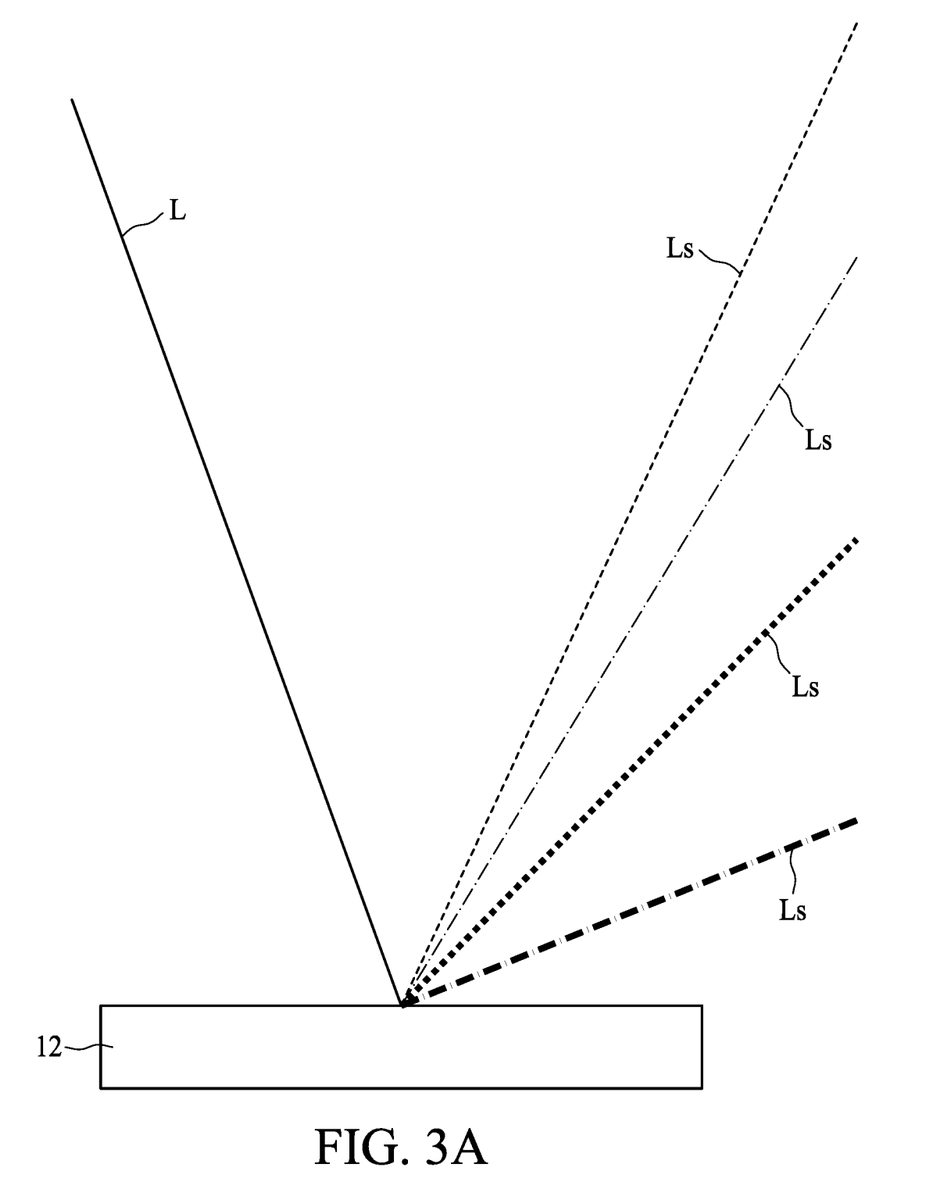
FIG. 3A is a schematic diagram illustrating a light dispersion device in accordance with some embodiments of the present disclosure.

FIG. 3 is a schematic diagram illustrating an ellipsometer in accordance with some embodiments of the present disclosure, and FIG. 3A is a schematic diagram illustrating a light dispersion device in accordance with some embodiments of the present disclosure. As shown in FIG. 3, the ellipsometer 1 includes a light source 10, a polarizer 20, an asymmetric wavelength retarder 30, an analyzer 40, and an optical detection component 50. The light source 10 is configured to provide a light beam L having multiple wavelengths incident to a sample S. The light beam L is a broadband electromagnetic irradiation having multiple wavelengths within a wavelength range. The wavelength range of the light beam L may be selected depending on the material of the sample S to be measured. In some embodiments, the light source 10 includes a visible light source configured to provide a visible light beam having multiple wavelengths within the visible light wavelength range. In some other embodiments, the light source 10 includes an invisible light source configured to provide an invisible light beam having multiple wavelengths within the invisible light wavelength range. For example, the invisible light may include infrared (IR), ultraviolet (UV), or the like. In still some other embodiments, the multiple wavelengths of the light beam L may cover both the visible light wavelength range and invisible light wavelength. By way of examples, the light source 10 may include a silicon-based light emitting diode device, an III-V group light emitting device, or other suitable illumination devices.

In some embodiments, the sample S includes a substrate 101 having a film 102 formed thereon, and the characteristic of the film 102 such as its thickness is to be measured. In some embodiments, the film 102 may be a transparent film. The light beam L is incident to the sample S with an incident angle $\theta_0$. In some embodiments, the incident angle $\theta_0$ is less than the total reflection angle of the film 102.

The polarizer 20 is disposed between the light source 10 and the sample S. The polarizer 20 is in a light incident path of the light beam L, and configured to polarize the light beam L. The polarizer 20 has a polarization transmission axis that can pass linearly polarized light parallel to the polarization transmission axis, such that the light beam L is converted to a linearly polarized light beam after passing through the polarizer 20.

In some embodiments, a light dispersion device 12 may be disposed between the light source 10 and the polarizer 20, and in the light incident path. The light dispersion device 12 is configured to disperse the light beam L into a plurality of monochromic sub-beams Ls of different wavelengths. By way of examples, the light dispersion device 12 may include a diffraction grating. In some embodiments, a reflective diffraction grating is selected as the light dispersion device 12 and illustratively drawn in FIG. 3 and FIG. 3A. The light dispersion device 12 is not limited to a reflective diffraction grating, and can include a transmission diffraction grating, a prism, or other suitable light dispersion devices that can disperse the multiple wavelength light beam L into multiple monochromic sub-beams Ls.

In some embodiments, a first optical lens 14 may be disposed between the light source 10 and the sample S in the light incident path, and configured to focus the light beam L on the sample S. For example, the first optical lens 14 may be disposed between the light dispersion device 12 and the polarizer 20, but is not limited thereto. In some other embodiments, the first optical lens 14 may be disposed in any location of the light incident path between the light source 10 and the sample S.

The asymmetric wavelength retarder 30 is configured to provide a varied retardation effect on the light beam L by wavelength. In some embodiments, the monochromic sub-beams Ls having different wavelengths are retarded by different degrees of retardation, and converted into a plurality of elliptically polarized sub-beams. In some embodiments, the asymmetric wavelength retarder 30 may include a waveplate such as a ¼λ waveplate, a ½λ waveplate or the like. By way of example, the asymmetric wavelength retarder 30 may include, but is not limited to, a zero-order quartz waveplate, a multiple-order quartz waveplate or the like. In some embodiments, the asymmetric wavelength retarder 30 is disposed in the light incident path. By way of example, the asymmetric wavelength retarder 30 is disposed between the polarizer 20 and the sample S, and the monochromic sub-beams Ls are retarded by different degrees of retardation before being reflected by the sample S.

Figure 4:
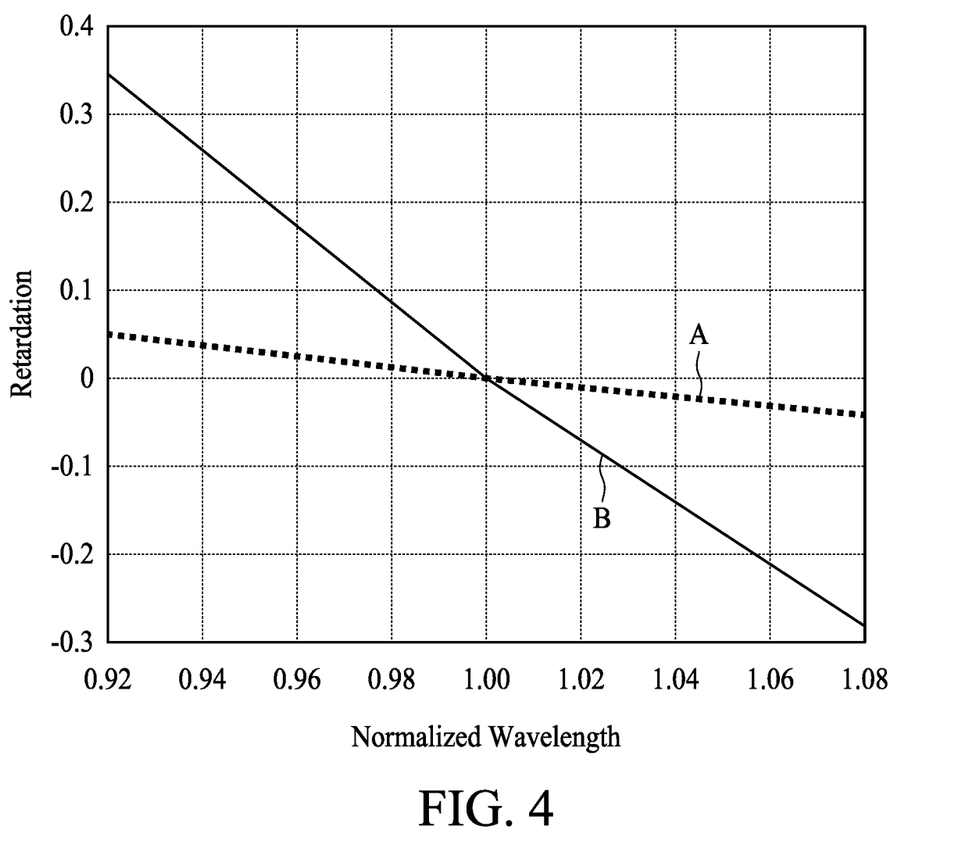
FIG. 4 is a schematic diagram illustrating a retardation effect vs. wavelength relation in accordance with some embodiments of the present disclosure.

Refer to FIG. 4. FIG. 4 is a schematic diagram illustrating a retardation effect vs. wavelength relation in accordance with some embodiments of the present disclosure, where X-axis represents normalized wavelength of incident light beams, and Y-axis represents retardation effect. In FIG. 4, curve A shows the retardation effect vs. wavelength relation of a zero-order quartz waveplate, and curve B shows the retardation effect vs. wavelength relation of multiple-order quartz waveplate. As shown in FIG. 4, both the zero-order quartz waveplate (indicated by curve A) and the multiple-order quartz waveplate (indicated by curve B) have varied retardation effect by wavelength of incident light beam. That is, when the multiple monochromic sub-beams Ls pass the asymmetric wavelength retarder 30, the degrees of retardation of the multiple monochromic sub-beams Ls are different after exiting the asymmetric wavelength retarder 30. As such, a plurality of monochromic sub-beams Ls having different polarization states are impinged on the sample S and reflected in a light reflection path. The varied retardation effect can be modified by selecting different types of the asymmetric wavelength retarders. For example, the multiple-order quartz waveplate may have more distinct retardation effect by wavelength compared with the zero-order quartz waveplate.

By selecting and calibrating the retardation effect v.s. wavelength of the asymmetric wavelength retarder 30 in advance, the second ellipsometric parameter $\Delta$ i.e. the phase difference between P component and S component of each of the monochromic sub-beams Ls can be determined. By virtue of the asymmetric wavelength retarder 30, the light beam L can be converted into a plurality of monochromic sub-beams Ls having different wavelengths instead of providing a plurality of monochromic sub-beams having different wavelengths in turn, which is time consuming.

The elliptically polarized sub-beams are converted into linearly polarized sub-beams Ls of different polarization states after reflected by the sample S. The analyzer 40 is disposed in the light reflection path of the light beam L, and configured to analyze polarization states of the light beam L including the monochromic sub-beams Ls reflected by the sample S. In some embodiments, the analyzer 40 is disposed between the sample S and the optical detection component 50. The analyzer 40 has a polarization transmission axis that can pass linearly polarized light parallel to the polarization transmission axis, such that the polarization states of the monochromic sub-beams Ls can be obtained. In some embodiments, the polarization states of the monochromic sub-beams Ls can be obtained by the following operations. The analyzer 40 may be arranged at a first position to pass the first polarized light components of the plurality of monochromic polarized sub-beams Ls in a first polarization direction. For example, the first polarized light component is the P component of the monochromic sub-beam Ls parallel to the incidence plane. The analyzer 40 may be then arranged at a second position to pass the second polarized light components of the plurality of monochromic polarized sub-beams Ls in a second polarization direction substantially perpendicular to the first polarization direction. For example, the second polarized light component is the S component of the monochromic sub-beam Ls perpendicular to the incidence plane. In some embodiments, the analyzer 40 can be switched between the first position and the second position by, e.g., rotation or the like.

In some embodiments, a second optical lens 16 may be disposed between the sample S and the optical detection component 50, and configured to collect the light beam L reflected from the sample S to the optical detection component 50. For example, the second optical lens 16 may be disposed between the analyzer 40 and the optical detection component 50, but is not limited thereto. In some other embodiments, the second optical lens 16 may be disposed in any location of the light reflection path between the sample S and the optical detection component 50.

The optical detection component 50 is disposed in the light reflection path of the light beam L, and configured to detect the light beam L from the analyzer 40. For example, the complex Fresnel reflection coefficients, i.e., the reflectivity Rp of P component in the reflected light beam L and the reflectivity Rs of S component in the reflected light beam L, can be detected. In some embodiments, the optical detection component 50 may include a plurality of pixels responsive to light beams of different wavelengths, respectively. As such, the multiple wavelengths containing in the light beam L with different retardation effects can be respectively detected to obtain a plurality sets of first ellipsometric parameters tanψ.

In some embodiments, the ellipsometer 1 further includes a processing unit 60, configured to control operation of the ellipsometer 1. For example, the processing unit 60 may be used to control the light source 10, switch the analyzer 40 between the first position and the second position, and estimate a thickness of the film based on the plurality sets of first ellipsometric parameters tanψ and the second ellipsometric parameters Δ.

Figure 5:
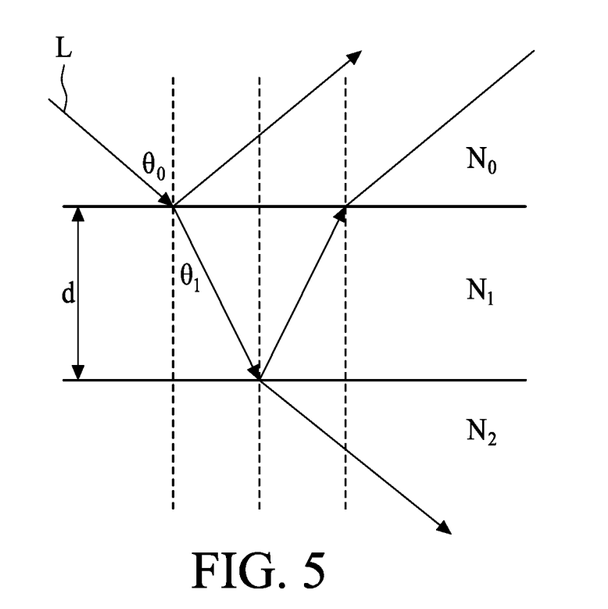
FIG. 5 is a schematic diagram illustrating a multiple reflection configuration of incident light beam in ellipsometry in accordance with some embodiments of the present disclosure.

FIG. 5 is a schematic diagram illustrating a multiple reflection configuration of incident light beam in ellipsometry in accordance with some embodiments of the present disclosure. As shown in FIG. 5, when the light beam L is incident on sample from the medium such as air or a liquid having a refraction index $N_0$ interfacing a first film of the sample having a refraction index $N_1$ at an incident angle $\theta_0$, a portion of the light beam L is reflected by the first film. Meanwhile, another portion of the light beam L enters the first film 101 and is refracted with a refraction angle $\theta_1$. The refracted portion of light beam L may then be reflected when reaching the interface between the first film and a second film having a refraction index $N_2$. The reflection and refraction of the light beam L can be repeated depending on the film number of the sample. Assuming the phase difference between the $n^{th}$ reflected light and the $n+1^{th}$ reflected light is 2 γ and the light reflected by the interface between the first film and the second film is 2 γ, the complex Fresnel reflection coefficient (Rs, Rp) can be expressed as following equations:

$$r_p = r_{01p} + t_{01p}t_{10p}r_{12p}e^{-i2\gamma} + \\ t_{01p}t_{10p}r_{10p}r_{12p}^2 e^{-i4\gamma} + t_{01p}t_{10p}r_{10p}^2 r_{12p}^3 e^{-i6\gamma} + \dots \quad (2)$$

$$r_s = \\ r_{01s} + t_{01s}t_{10s}r_{12s}e^{-i2\gamma} + t_{01s}t_{10s}r_{10s}r_{12s}^2 e^{-i4\gamma} + t_{01s}t_{10s}r_{10s}^2 r_{12}^3 e^{-i6\gamma} + \dots \quad (3)$$

$$r_{ijp} = \frac{N_j\cos\theta_i - N_i\cos\theta_j}{N_j\cos\theta_i + N_i\cos\theta_j} \quad (4)$$

$$r_{ijs} = \frac{N_i\cos\theta_i - N_j\cos\theta_j}{N_i\cos\theta_i + N_j\cos\theta_j} \quad (5)$$

$$t_{ijp} = \frac{2N_i\cos\theta_i}{N_j\cos\theta_i + N_i\cos\theta_j} \quad (6)$$

$$t_{ijs} = \frac{2N_i\cos\theta_i}{N_i\cos\theta_i + N_j\cos\theta_j} \quad (7)$$

$$\gamma = \frac{2\pi d N_j}{\lambda}\cos\theta_1 \quad (8)$$

where
d is the thickness of the film;
λ is the wavelength of the light beam;
$r_{ijp}$ is the reflection coefficient from a medium j to a medium j in p polarized direction;
$r_{ijs}$ is the reflection coefficient from a medium j to a medium j in s polarized direction;
$t_{ijp}$ is the transmission coefficient from a medium j to a medium j in p polarized direction; and
$t_{ijs}$ is the transmission coefficient from a medium j to a medium j in s polarized direction.

The overall reflection coefficient can be expressed as the following equations.

$$r_p = r_{01p} + \frac{t_{01p}t_{10p}r_{12p}e^{-i2\gamma}}{1 - r_{10p}r_{12p}e^{-i2\gamma}} \quad (9)$$

$$r_s = r_{01s} + \frac{t_{01s}t_{10s}r_{12s}e^{-i2\gamma}}{1 - r_{10s}r_{12s}e^{-i2\gamma}} \quad (10)$$

Since $r_{10} = -r_{10}$ and $t_{01}t5_{10} = 1 - r_{01}^2$, an equation (11) can be derived as follows.

$$\rho = \frac{r_p}{r_s} = \tan\Psi e^{i\Delta} = \frac{r_p}{r_s} = \frac{r_{01p} + r_{12p}e^{-i2\gamma}}{1 + r_{01p}r_{12p}e^{-i2\gamma}} \frac{1 + r_{01s}r_{12s}e^{-i2\gamma}}{r_{01s} + r_{12s}e^{-i2\gamma}} \quad (11)$$

Accordingly, once the plurality sets of first ellipsometric parameter tang and second ellipsometric parameter Δ are obtained, the thickness d of the film can be estimated by mathematic calculation such as regression method based on equations (8) and (11).

In some embodiments of the present disclosure, the ellipsometer uses a multiple wavelength light source and an asymmetric wavelength retarder. The asymmetric wavelength retarder can provide a varied retardation effect on the multiple wavelength light beam by wavelength, such that a plurality of sub-beams of different retardation effects can be generated simultaneously. The sub-beams of different retardation effects reflected by the sample therefore have different polarization states. The polarization states of the plurality of sub-beams can be analyzed by an analyzer, and detected by an optical detection component. Accordingly, a plurality sets of ellipsometric parameters can be measured at the same time. Since the plurality sets of ellipsometric parameters representing the plurality of sub-beams can be measured at the same time, the film thickness can be rapidly estimated.

The ellipsometer and its estimation method are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6:
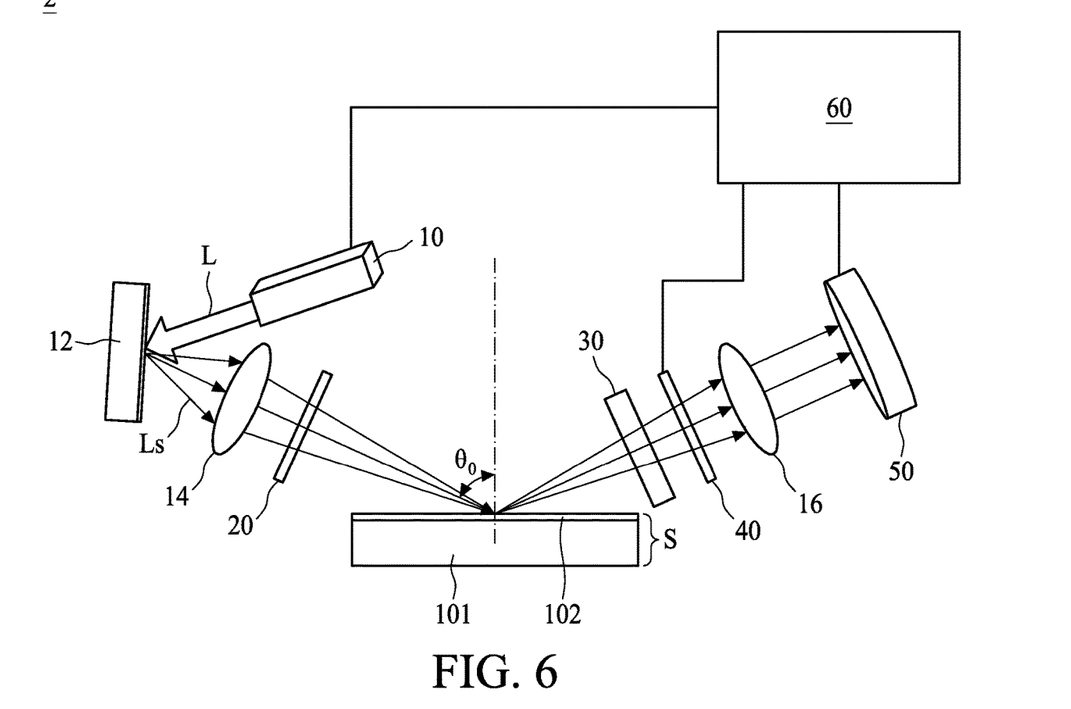
FIG. 6 is a schematic diagram illustrating an ellipsometer in accordance with some embodiments of the present disclosure.

FIG. 6 is a schematic diagram illustrating an ellipsometer in accordance with some embodiments of the present disclosure. As shown in FIG. 6, in contrast to the ellipsometer 1 of FIG. 3, the asymmetric wavelength retarder 30 is disposed in the light reflection path. By way of example, the asymmetric wavelength retarder 30 is disposed between the sample S and the analyzer 40. In some embodiments, the monochromic sub-beams Ls are linearly polarized sub-beams after passing the polarizer 20, and converted to elliptically polarized sub-beams after being reflected by the sample S. The elliptically polarized sub-beams are retarded by different degrees of retardation after passing the asymmetric wavelength retarder 30, and converted to linearly polarized sub-beams of different polarization states. The linearly polarized sub-beams of different polarization states then can be analyzed by the analyzer 40, and detected by the optical detection component 50 to obtain a plurality sets of first ellipsometric parameters tanψ. On the other hand, the second ellipsometric parameters Δ can be obtained by, for example, selecting and calibrating the retardation effect v.s. wavelength of the asymmetric wavelength retarder 30 in advance. Accordingly, a processing unit 60, configured to control operation of the ellipsometer 1. For example, the processing unit 60 is able to estimate a thickness of the film based on the plurality sets of first ellipsometric parameters tanψ and the second ellipsometric parameters Δ.

Figure 7:
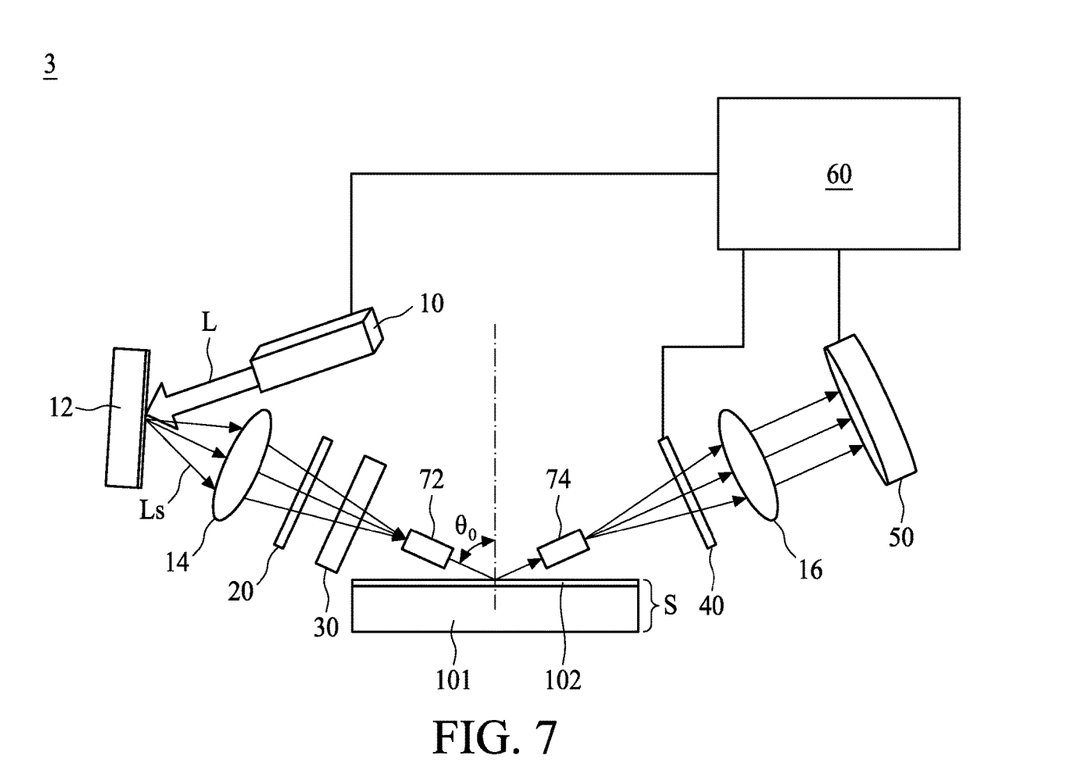
FIG. 7 is a schematic diagram illustrating an ellipsometer in accordance with some embodiments of the present disclosure.

FIG. 7 is a schematic diagram illustrating an ellipsometer in accordance with some embodiments of the present disclosure. As shown in FIG. 7, the ellipsometer 3 may further include a light coupling component such as a first optical fiber 72 and a second optical fiber 74. The first optical fiber 72 is disposed in the light incident path, and configured to couple the light beam L from the light source 10 to the sample S. The second optical fiber 74 is disposed in the light reflection path, and configured to couple to light beam L reflected by the sample S to the optical detection component 50. In some embodiments, the ellipsometer 3 with light coupling components can be integrated into an apparatus to in-situ estimating a thickness of the sample S being processed.

Figure 8:
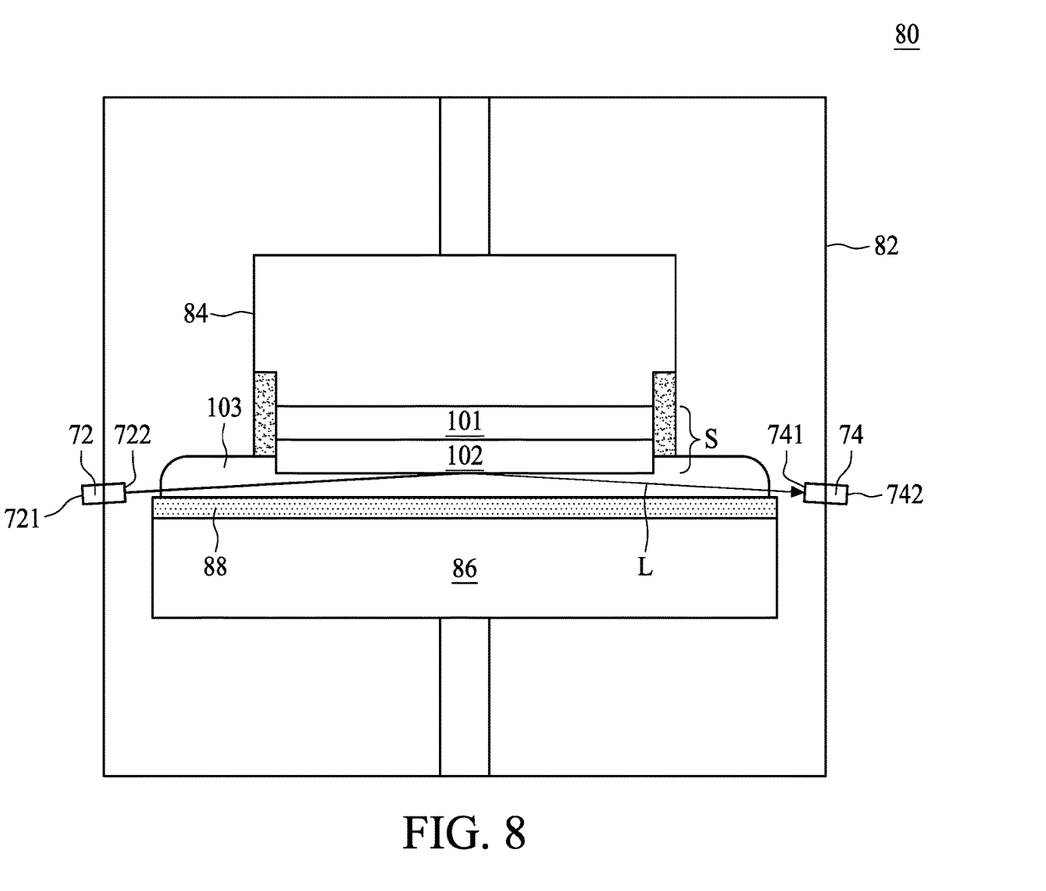
FIG. 8 is a schematic diagram illustrating an apparatus in accordance with some embodiments of the present disclosure.

FIG. 8 is a schematic diagram illustrating an apparatus in accordance with some embodiments of the present disclosure. In some embodiments, the apparatus 80 may include a semiconductor manufacturing apparatus such as a CMP apparatus, but is not limited thereto. As shown in FIG. 7 and FIG. 8, the apparatus 80 may include a chamber 82, a supporter 84, a platen 86, a polish pad 88 and an ellipsometer. The supporter 84 is disposed in the chamber 82, and configured to support a substrate 101 having a film 102. The platen 86 is disposed in the chamber 82 and opposite to the supporter 84. The polish pad 88 is disposed in the chamber 82 and over the platen 86. In some embodiments, the film 102 may be wet when measuring the thickness of the film 102 during the CMP operation. For example, a liquid 103 such as polishing slurry may be dispensed between the polish pad 88 and the film 102 when measuring the thickness of the film 102 during the CMP operation.

The ellipsometer may include an ellipsometer with a light coupling component. In some embodiments, the ellipsometer may be the ellipsometer 3 with the first optical fiber 72 and the second optical fiber 74 as illustrated in FIG. 7, but is not limited thereto. The ellipsometer may include the ellipsometer 1 or 2 as illustrated in FIG. 3 or FIG. 6.

In some embodiments, some or all of the light source 10, the light dispersion device 12, the polarizer 20, the asymmetric wavelength retarder 30, the analyzer 40, the optical detection component 50, the first optical lens 14, the second optical lens 16 and the processing unit 60 may be disposed outside the chamber 82. The light coupling component may be at least partially disposed in the chamber 82 and configured to couple the light beam L from the light source 10 outside the chamber 80 to the film 102 and the substrate 101 in the chamber 80, and couple the light beam L reflected by the film 102 and the substrate 101 to the optical detection component 50 outside the chamber 82. In some embodiments, the film 102 is covered with the liquid 103 such as slurry, and the light beam L is incident to the film 102 through the liquid 103. In some embodiments, the first optical fiber 72 has a light receiving end 721 in the light incident path for receiving the light beam L, and a light exiting end 722 for directing the light beam L to the film 102 and the substrate 101. The second optical fiber 74 has a light receiving end 741 in the light reflection path for coupling the light beam L reflected by the film 102 and the substrate 101, and a light exiting end 742 for re-directing the light beam L to the optical detection component 50.

The apparatus 80 with the integrated ellipsometer allows obtaining the ellipsometric parameters during the CMP operation, and thus the thickness of the film 102 can be in-situ estimated to detect end point of the CMP operation.

Figure 9:
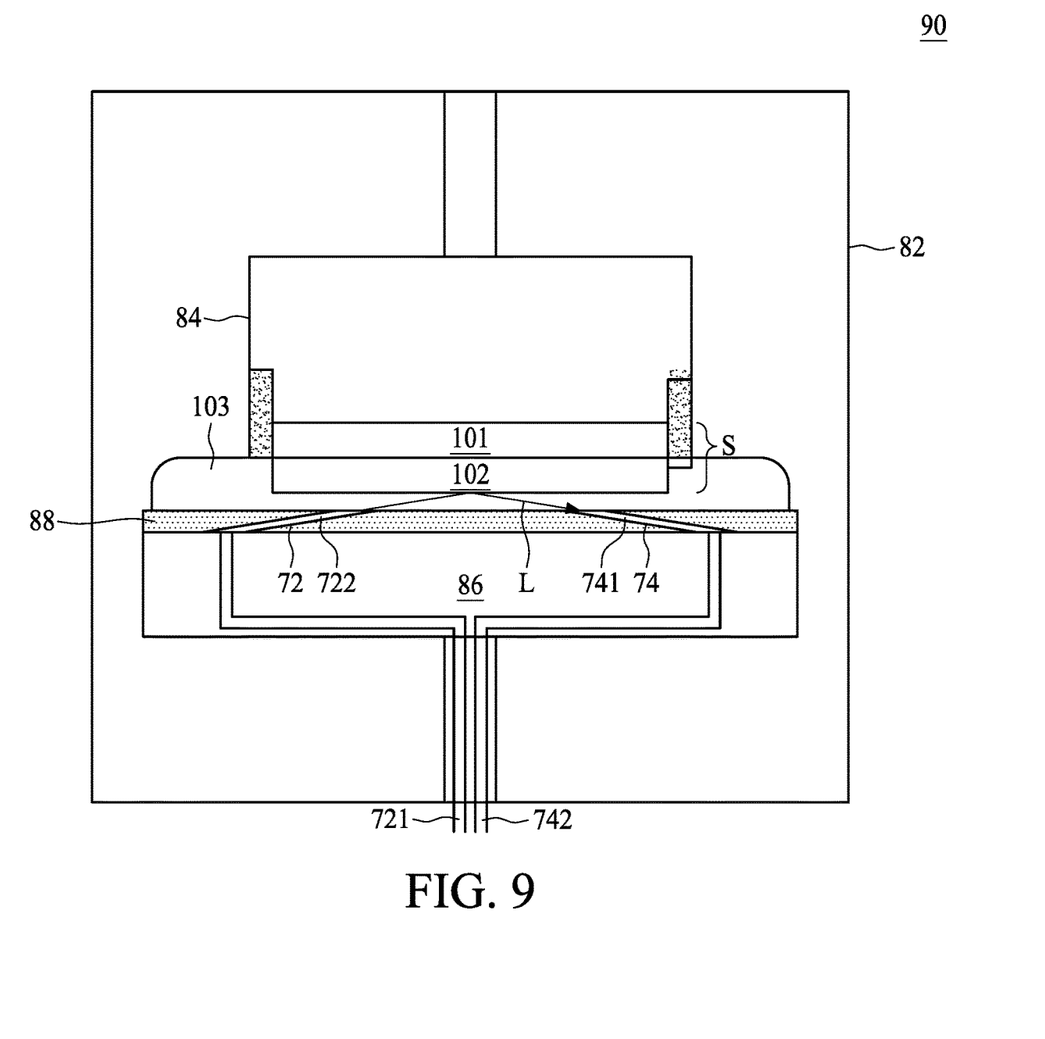
FIG. 9 is a schematic diagram illustrating an apparatus in accordance with some embodiments of the present disclosure.

FIG. 9 is a schematic diagram illustrating an apparatus in accordance with some embodiments of the present disclosure. As shown in FIG. 7 and FIG. 9, in contrast to the apparatus 80 of FIG. 8, the first optical fiber 72 and the second optical fiber 74 of the apparatus 90 are disposed in the polish pad 88. In some embodiments, the light exiting end 722 of the first optical fiber 72 and the the light receiving end 741 of the second optical fiber 74 are exposed in the surface of the polish pad 88, to direct the light beam L to the film 102 and the substrate 101, and to re-direct the light beam L to the optical detection component 50.

In some embodiments of the present disclosure, an ellipsometer using a multiple wavelength light source and an asymmetric wavelength retarder is provided. The asymmetric wavelength retarder is able to provide a varied retardation effect on the multiple wavelength light beam by wavelength, such that a plurality of sub-beams of different retardation effects can be generated simultaneously. The sub-beams of different retardation effects reflected by the sample therefore have different polarization states. The polarization states of the plurality of sub-beams can be analyzed by an analyzer, and detected by an optical detection component. Accordingly, a plurality sets of ellipsometric parameters can be measured at the same time, and the film thickness can be rapidly estimated. In some embodiments of the present disclosure, an apparatus with the ellipsometer allows obtaining the ellipsometric parameters during the semiconductor operation, and thus the thickness of the film can be in-situ estimated. The ellipsometer uses a non-destructive optical measurement approach to measure the thickness, which does not destroy the sample during measurement. The ellipsometer is advantageous for its high accuracy, particularly in measuring a thin film having a thickness less than 100 micrometers, and its high measuring speed. The ellipsometer uses an asymmetric wavelength retarder to provide a varied retardation effect on the multiple wavelength light beam by wavelength, such that a plurality of sub-beams of different retardation effects can be generated simultaneously. Accordingly, the thickness of the film can be rapidly estimated.

In some embodiments, an ellipsometer includes a light source, a polarizer, an asymmetric wavelength retarder, an analyzer and an optical detection component. The light source is configured to provide a light beam having multiple wavelengths incident to a sample. The polarizer is disposed between the light source and the sample, and configured to polarize the light beam. The asymmetric wavelength retarder is configured to provide a varied retardation effect on the light beam varied by wavelength. The analyzer is configured to analyze a polarization state of the light beam reflected by the sample. The optical detection component is configured to detect the light beam from the analyzer.

In some embodiments, an apparatus includes a chamber, a supporter and an ellipsometer. The supporter is disposed in the chamber and configured to support a substrate having a film formed thereon. The ellipsometer is configured to in-situ estimate a thickness of the film. The ellipsometer includes a light source, an asymmetric wavelength retarder and an optical detection component. The light source is configured to provide a light beam having multiple wavelengths incident to the film. The asymmetric wavelength retarder is configured to provide a varied retardation effect on the light beam by wavelength. The optical detection component is configured to detect the light beam reflected by the film.

In some embodiments, a method for estimating a thickness of a film includes the following operations. A light beam having multiple wavelengths incident to a film is provided. The light beam is dispersed to form a plurality of monochromic sub-beams of different wavelengths. The light beam is polarized before the light beam is incident to the film. The plurality of monochromic polarized sub-beams are modulated such that the plurality of monochromic polarized sub-beams of different wavelengths have different retardation effects. The polarization states of the plurality of monochromic polarized sub-beams reflected by the sample are analyzed. The polarization states of the plurality of monochromic polarized sub-beams are detected to obtain a plurality sets of first ellipsometric parameters. The thickness of the film is estimated according to the plurality sets of first ellipsometric parameters.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ellipsometer, comprising:
   a light source, configured to provide a light beam having multiple wavelengths incident to a sample;
   a polarizer, disposed between the light source and the sample, and configured to polarize the light beam;
   a light dispersion device disposed between the light source and the polarizer, and configured to disperse the light beam into a plurality of monochromic sub-beams of different wavelengths;
   an asymmetric wavelength retarder, configured to provide a varied retardation effect on the light beam varied by wavelength;
   an analyzer, configured to analyze a polarization state of the light beam reflected by the sample; and
   an optical detection component, configured to detect the light beam from the analyzer.

2. The ellipsometer of claim 1, wherein the asymmetric wavelength retarder is disposed between the polarizer and the sample.

3. The ellipsometer of claim 1, wherein the asymmetric wavelength retarder is disposed between the sample and the analyzer.

4. The ellipsometer of claim 1, further comprising:
   a first optical lens between the light source and the sample, and configured to focus the light beam on the sample; and
   a second optical lens between the sample and the optical detection component, and configured to collect the light beam reflected from the sample to the optical detection component.

5. The ellipsometer of claim 1, wherein the light source comprises a visible light source configured to provide a visible light beam.

6. The ellipsometer of claim 1, wherein the light source comprises an invisible light source configured to provide an invisible light beam.

7. The ellipsometer of claim 1, wherein the sample is covered with a liquid, and the light beam is incident to the sample through the liquid.

8. The ellipsometer of claim 1, further comprising a processing unit, configured to estimate a thickness of the sample based on the plurality sets of ellipsometric parameters.

9. An apparatus, comprising:
   a chamber;
   a supporter, disposed in the chamber and configured to support a substrate having a film formed thereon; and
   an ellipsometer, configured to in-situ estimate a thickness of the film, wherein the ellipsometer comprises:
      a light source configured to provide a light beam having multiple wavelengths incident to the film;
      an asymmetric wavelength retarder configured to provide a varied retardation effect on the light beam by wavelength;
      a light dispersion device configured to disperse the light beam provided by the light source into a plurality of monochromic sub-beams of different wavelengths onto the film; and
      an optical detection component, configured to detect the light beam reflected by the film.

10. The apparatus of claim 9, wherein the ellipsometer further comprises:
    a polarizer, disposed between the light source and the film, and configured to polarize the light beam;
    an analyzer, configured to analyze a polarization state of the light beam reflected by the film; and
    a processing unit, configured to estimate a thickness of the film based on the plurality sets of ellipsometric parameters.

11. The apparatus of claim 10, wherein the light dispersion device is disposed between the light source and the polarizer.

12. The apparatus of claim 9, further comprising a light coupling component at least partially disposed in the chamber and configured to couple the light beam from the light source outside the chamber to the film and the substrate in the chamber, and couple the light beam reflected by the film and the substrate to the optical detection component outside the chamber.

13. The apparatus of claim 12, wherein the light coupling component comprises:
    a first optical fiber configured to direct the light beam from the light source to the sample; and
    a second optical fiber configured to direct the light beam reflected by the sample to the optical detection component.

14. The apparatus of claim 13, further comprising:
    a platen, disposed in the chamber and opposite to the supporter; and
    a polish pad, disposed in the chamber and over the platen, wherein the first optical fiber and the second optical fiber are disposed in the platen.

15. The apparatus of claim 9, wherein the light dispersion device comprises a diffraction grating.

16. A method for estimating a thickness of a film, comprising:
    providing a light beam having multiple wavelengths incident to a film;
    dispersing the light beam to form a plurality of monochromic sub-beams of different wavelengths;
    polarizing the light beam before the light beam is incident to the film;
    modulating the plurality of monochromic polarized sub-beams such that the plurality of monochromic polarized sub-beams of different wavelengths have different retardation effects;
    analyzing polarization states of the plurality of monochromic polarized sub-beams reflected by the sample;
    detecting the polarization states of the plurality of monochromic polarized sub-beams to obtain a plurality sets of first ellipsometric parameters; and estimating a thickness of the film according to the plurality sets of first ellipsometric parameters.

17. The method of claim 16, wherein the modulating the plurality of monochromic polarized sub-beams comprises passing the plurality of monochromic polarized sub-beams through an asymmetric wavelength retarder to render the plurality of monochromic polarized sub-beams different retardation effects.

18. The method of claim 16, wherein the analyzing the polarization states of the plurality of monochromic polarized sub-beams reflected by the sample comprises:
   providing an analyzer having a polarization transmission axis;
   arranging the analyzer at a first position to pass first polarized light components of the plurality of monochromic polarized sub-beams in a first polarization direction; and
   arranging the analyzer at a second position to pass second polarized light components of the plurality of monochromic polarized sub-beams in a second polarization direction substantially perpendicular to the first polarization direction.

19. The method of claim 16, wherein the first ellipsometric parameter is $\tan \psi$, the first ellipsometric parameter $\tan \psi$ is an amplitude ratio of the first polarized light component to the second polarized light component.

20. The method of claim 19, further comprising obtaining a plurality sets of second ellipsometric parameters of the plurality of monochromic polarized sub-beams, wherein the second ellipsometric parameter $\Delta$ is a phase difference between the first polarized light component and the second polarized light component.

* * * * *